United States Patent [19]

Bert et al.

[11] 4,110,839

[45] Aug. 29, 1978

[54] NON-VOLATILE LONG MEMORY FOR FAST SIGNALS

[75] Inventors: Alain Bert; Gerard Kantorowicz, both of Paris, France

[73] Assignee: Thomson-CSF, Paris, France

[21] Appl. No.: 835,010

[22] Filed: Sep. 20, 1977

[30] Foreign Application Priority Data

Sep. 24, 1976 [FR] France .................................. 76 28765

[51] Int. Cl.$^2$ ....................... G11C 13/00; G11C 11/40
[52] U.S. Cl. ....................................... 365/180; 307/238; 365/174; 365/182; 365/184
[58] Field of Search ................. 307/238; 365/174, 177, 365/180, 182, 184

[56] References Cited

U.S. PATENT DOCUMENTS 3,729,719 4/1973 Weidmann .................. 365/180

Primary Examiner—Terrell W. Fears
Attorney, Agent, or Firm—Roland Plottel

[57] ABSTRACT

A memory for the non-volatile, long recording of fast signals. It is formed by two memory stages:
- a first stage, containing in particular a capacitor (C) and a diode (D), which records the input signal ($V_s$) by charge accumulation for a time long enough for the signal to be transferred to the second stage;
- a second stage, formed by an MIIS type element (E), which ensures a non-volatile, long recording of these charges and, hence, of the signal $V_s$.

19 Claims, 13 Drawing Figures

NON-VOLATILE LONG MEMORY FOR FAST SIGNALS

The present invention covers a non-volatile, long memory for fast electric signals.

In certain applications it is necessary to have memories which enable data to be stored for a very long time (several months for example) on the one hand and which, on the other, have a sufficiently short recording time to allow fast signals to be recorded. Finally, it is preferable that such a memory be non-volatile, i.e. that it retains its contents when the power supply is cut off.

Known solid state, non-volatile, long life memory systems, among which may be mentioned in particular MNOS type (Metal — Nitride — Oxide — Semiconductor) structures, are not generally very useful for fast signals, of the order of a nanosecond for example, because their recording time are too long.

According to the present invention, there is provided a non-volatile, long memory for fast signals, comprising at least a first storage stage, comprising a capacitor (C) with two terminals (P and Q) and a diode (D) having two terminals (U and P); a second storage stage with an MIIS element (E); means for storing said fast signal in said first stage by the accumulation of a quantity of electric charges which is a function of said fast signal during a time at least equal to the time for storing a signal in said second stage, said storage in said second stage being done by means of the accumulation at least of a fraction of said quantity of charges at the terminals of the MIIS element.

Figure 1:
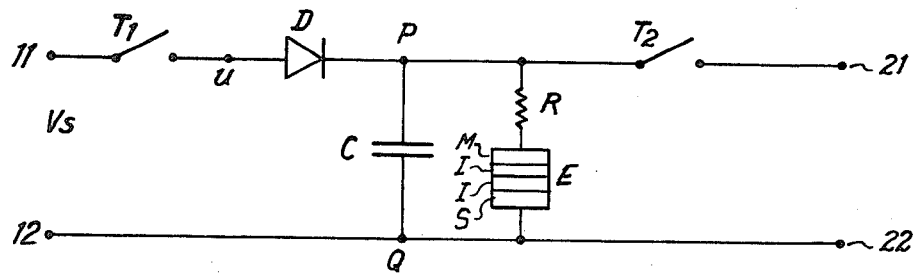
Figure 2:
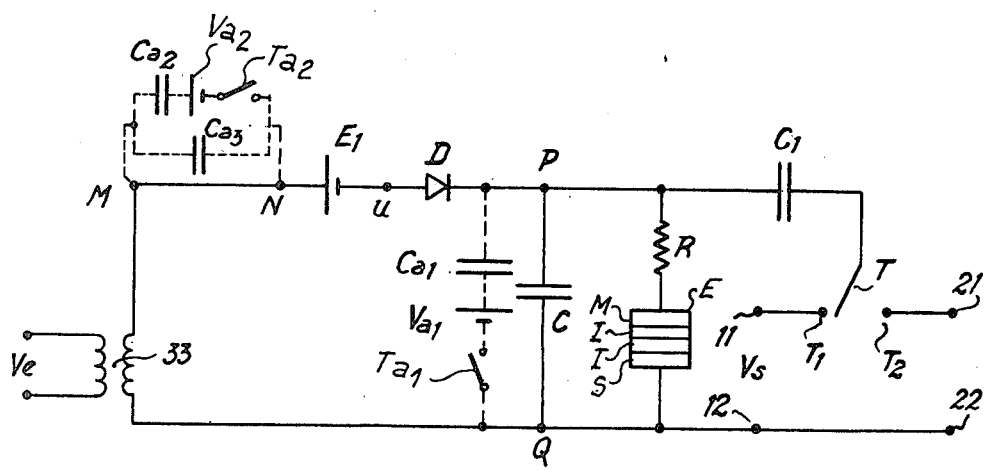
Figure 3:
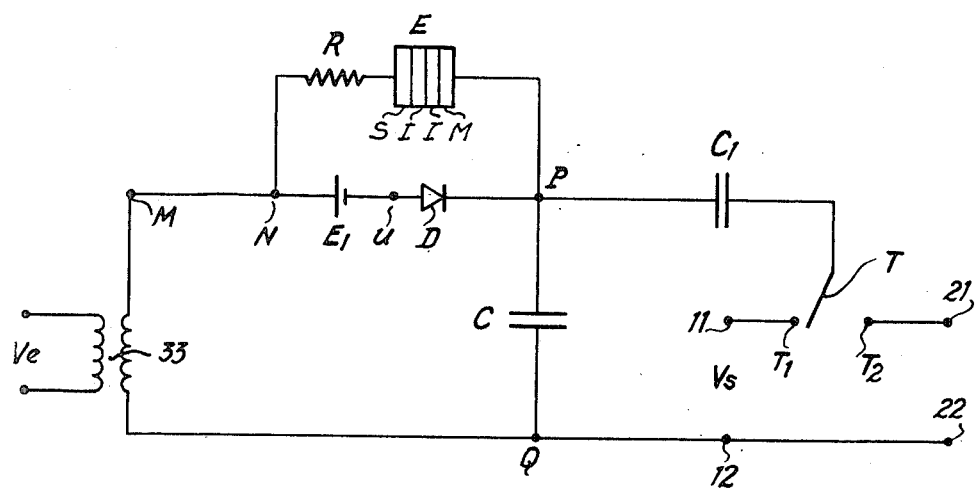
Figure 4A:
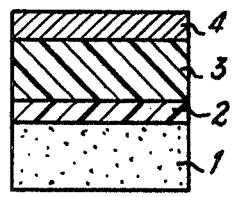
Figure 4B:
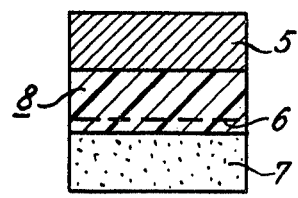
Figure 4C:
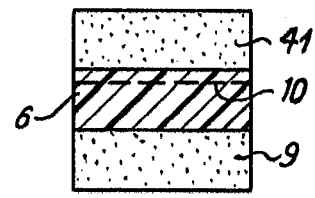
Figure 7:
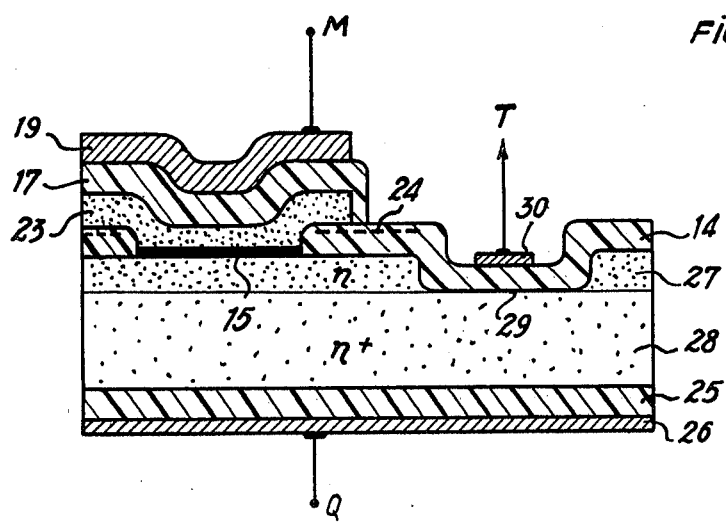
Figure 8:
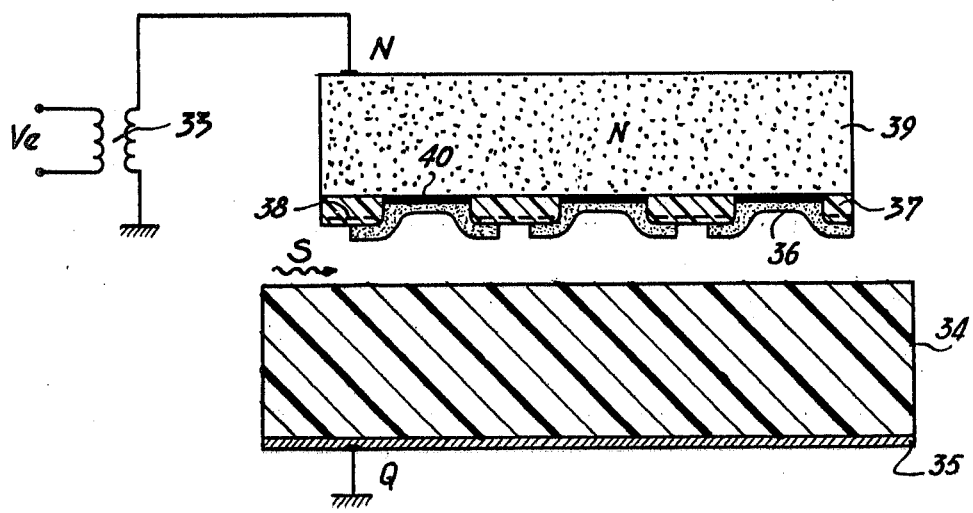

The invention will be better understood with the help of the following description, which is given as a non-limiting example and is illustrated by the drawings attached that show:

FIGS. 1, 2 and 3, equivalent electrical circuits of different embodiments of a memory device in accordance with the invention;

FIGS. 4a, 4b and 4c, ways of producing the MIIS element used in the device in accordance with the invention;

FIGS. 5a, 5b, 5c and 6a, 6b, actual embodiments of the equivalent circuits of FIGS. 1 and 2;

FIG. 7, an actual embodiment of the equivalent circuit of FIG. 3;

FIG. 8, an actual embodiment of the equivalent circuit of FIG. 3, which uses elastic surface waves.

In these various figures, the same references are used for the same elements.

FIG. 1 shows the equivalent electrical circuit of one embodiment of a device in accordance with the invention. The diagram is made up as follows:

In series with an input terminal 11 there is a switch $T_1$, a first connection point U, a diode D, a seconde connection point P, a second switch $T_2$ and an output terminal 21. At the point P are connected in parallel a capacitor C on the one hand, and a resistor R in series with an MIIS type structure E on the other. These two parallel branches are connected at a point Q, which is itself connected to a second input terminal 12 and a second output terminal 22. With the polarities adopted on the diagram (diode D going from terminal 11 to point P), the direction of connection of the MIIS element is such that its semiconductor part is connected to point Q.

It may be remembered that an MIIS structure is formed by a layer of metal covered by an insulating layer, which is itself covered by a very thin (a few tens of Angstroms thick) second insulating layer and finally by a semiconducting layer. A special case of such a structure is known under the initials MNOS, i.e. Metal — Nitride (of silicon) — Oxide (of silicon) — Semiconductor (silicon). When a positive voltage with respect to the semiconductor is applied to the metal, electrons coming from the semiconductor pass through the thin insulating layer under a tunnel effect and are trapped at the interface of the two insulating layers. The recording thus obtained can be maintained for a very long time, about a year. Erasure can be obtained by applying a voltage in the opposite direction for example.

In operation, the signal $V_s$ to be recorded is applied between terminals 11 and 12, switch $T_1$ being closed and switch $T_2$ open. Voltage $V_s$ thus applied, charges capacitor C through diode D. This forms the first phase of the recording, in which the time to record may be very short, i.e. the signal $V_s$ may be very short, about a nanosecond for example.

After this first phase, part of the charges distribute themselves in the MIIS element E. The electric field they produce between the metal and the semiconductor tends to transfer these same charges from the semiconductor to the interface between the two insulating layers where they are recorded. This MIIS element forms the second stage of the device in accordance with the invention, giving a long, nonvolatile recording of the electrical charges in a quantity proportional to the amplitude of the input signal $V_s$.

As far as the resistor R is concerned, its value is chosen such that quantitatively only capacitor C is concerned in the first phase of recording. Also, the value of capacitor C can then be chosen to be adapted to the chracteristics of signal $V_s$, independently of the MIIS element.

Reading takes place between terminals 21 and 22 by closing switch $T_2$, for example by using an MOS type (Metal — Oxide — Semiconductor) field effect transistor. In this case, this transistor's grid capacity may act the role of the capacitor C.

Signal $V_s$ applied to input terminals 11 and 12 may be sampled first, the opening of switch $T_1$ then enclosing the sample to be recorded. Sampling can also be carried out directly by switch $T_1$.

Erasure of the information stored in the MIIS element is obtained by the application of a reverse electrical field, i.e. directed from the semiconductor to the metal, thanks to a signal applied to terminals 11 and 12 for example.

It may be noted that, in this embodiment, on the one hand signal $V_s$ must always have the same sign (positive in the case in the figure) and, on the other, the charging time for capacitor C is a function of the amplitude of $V_s$. This embodiment is therefore more especially adapted to digital signals.

FIG. 2 shows the equivalent electrical circuit of another embodiment of the recording device in accordance with the invention.

On this diagram, there is the capacitor C in parallel with resistor R and the MIIS element E connected in the same direction as in FIG. 1. The signal $V_s$ to be recorded is applied between terminals 11 and 12, terminal 12 being connected to point Q as before. Terminal 11 is connected, when a switch T is in the position $T_1$, to point P through a capacitor $C_1$. Output terminals 21 and 22 are connected respectively to capacitor $C_1$ when switch T is in position $T_2$ and to point Q. Diode D, a connection point U, a voltage source $E_1$, two connection points N and M and a coupling device 33 enabling a signal $V_e$ to be introduced into the circuit, are also connected in series between points P and Q.

A capacitor, a voltage source and a switch in series are also shown dotted in FIG. 2. They are either connected between points P and Q ($C_{a1}$, $V_{a1}$ and $T_{a1}$), or ($C_{a2}$, $V_{a2}$ and $T_{a2}$) connected to the terminals of a capacitor $C_{a3}$ placed between points M and N; their role will be discussed later.

In operation, the signal to be recorded $V_s$, applied between terminals 11 and 12, polarizes diode D more or less according to its amplitude. If the capacity of $C_1$ is greater than that of diode D, signal $V_s$ is practically at the terminals P and Q of capacitor C. Voltage $E_1$ can be introduced in series with D so that, no matter what the positive or negative amplitude of the signal, diode D is always polarized in the reverse direction. When a pulse of amplitude $V_e$ greater than that of $V_s$ is applied to element 33 in a direction such that it causes diode D to conduct, the voltage $V_e$ (or $V_e - E_1$) is found at the terminals of capacitor C.

As previously, after this first phase, part of the charges are distributed in the MIIS element E and the electic field thus produced tends to transfer these same charges to the interface of the two insulating layers where they are recorded.

The recording process during the second phase can be controlled with advantage by the auxiliary voltage $V_a$, either to increase the speed or prevent an increase or again to eliminate the charges already stored, i.e. to erase.

As was said above, voltage $V_a$ can be introduced into the circuit in two ways:
 either between points P and Q, the purpose of capacitor $C_{a1}$ being to prevent the drift of the charges accumulated towards the souce $V_{a1}$;
 or between points M and N, the link MN being replaced by a high value capacitor $C_{a3}$ and the source $V_{a2}$ being placed at the terminals of $C_{a3}$, capacitor $C_{a2}$ having the same role as capacitor $C_{a1}$ previously.

In either case, an electric field is produced in the MIIS, from the metal towards the semiconductor, after the first recording phase (switch $T_a$ then being closed) and an insulator-insulator interface charging current appears. The MIIS element E being previously more or less charged depending on the amplitude of signal $V_s$, the electric field appearing in the MIIS is a function of $V_s$ and hence of the quantity of charges trapped.

It may be noted that, for small values of said quantity of charges trapped, this function is linear. The role of voltage $V_a$, which must then be much greater than the potential difference induced by signal $V_s$, is essentially to accelerate the process and make the effects linear. Finally, on the diagram is shown a direction for voltage $V_a$ such that it makes the recording process easier; evidently, by reversing the direction of $V_a$, the inhibition of the recording process or even the erasure of the data stored can be obtained.

In the diagram of FIG. 2, reading can be done as in the case of FIG. 1 at terminals 21 and 22, switch T being in the position $T_2$.

Erasure is obtained by subjecting the MIIS element to a reverse electric field (directed towards the metal) by the application of a potential difference between points P and Q, the circuit then being cut between points M and N.

This embodiment enables a quantity of charges proportional to the signal to be stored, no matter what the sign of this signal, and in that way is adapted to the case of analog signals. Smapling is here carried out by the writing pulse $V_e$.

FIG. 3 shows the equivalent electrical circuit of a third embodiment of the recording device in accordance with the invention.

This embodiment is identical to that of FIG. 2 except for what concerns the MIIS element E and resistor R. These are connected in FIG. 3 between points P and N, the metallic part of the MIIS being placed on the side of point P and the semiconductor part on the side of point N.

The operation in two phases is analogous to that of the device in FIG. 2 and, in the same way, it is possible to control the second phase by the addition of an auxiliary voltage $V_a$.

As far as erasure of the date stored in the MIIS element is concerned, this cannot be obtained by the application of a positive potential difference $V_{N-P}$ because diode D is then short-circuiting the MIIS element. Then, the lighting of the MIIS can be used to accelerate the output of electrons from the insulator-insulator interface traps.

FIGS. 4a, 4b and 4c show ways of producing the MIIS element E.

On FIG. 4a is shown a silicon substrate 1 covered with a thin oxide layer 2 on which a silicon nitride layer 3 forming the second insulating layer is deposited, followed by a layer of metal 4. An MNOS element is thus obtained.

Another method is shown in FIG. 4b. A silicon substrate 7 is covered with a thick layer of silicon oxide in which is produced, e.g. by ion implant, a zone 6 as trap for the charge carriers. That zone is created to a depth controlled by the energy of the implanted ions and such that the oxide thickness between zone 6 and the silicon 7 is small. The oxide 8 is then covered with a metallic layer 5. The silicon 7 may be, for example, of polycrystalline silicon doped with type P impurities.

A third method is shown in FIG. 4c. It consists in oxidizing (layer 6) a highly doped substrate of silicon 9 and then in implanting low energy ions to produce a trap area 10 near the oxide surface 6. Then a semiconductor layer 41 is deposited, type P polycristalline silicon for example. The silicon 9 here plays the role of the metallic layers (4 and 5) in the preceding figures.

Figure 5A:
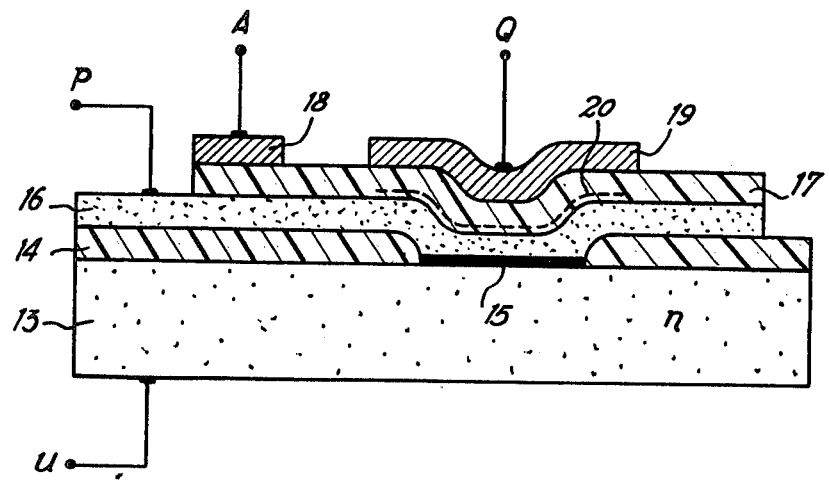
Figure 5B:
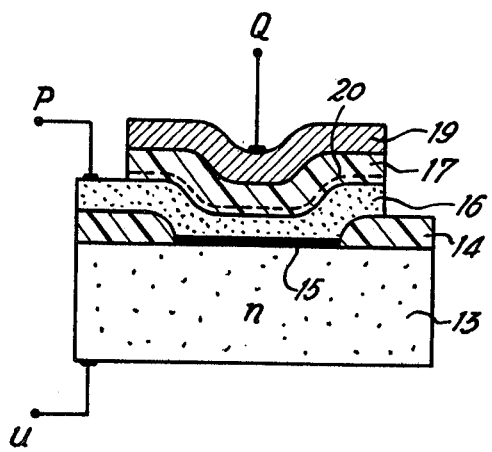
Figure 5C:
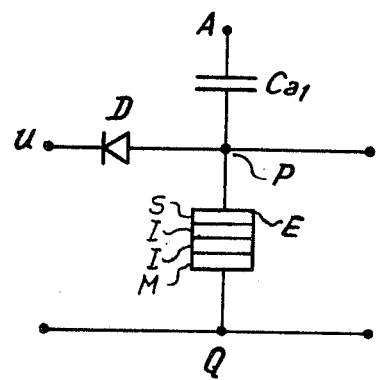

FIGS. 5a and 5b show a first mode of integrated production of the devices of FIGS. 1 and 2, FIG. 5c being their equivalent electrical circuit.

The device in FIG. 5a is formed by a semiconductor substrate 13, type N silicon for example, covered successively by:
 an insulating layer 14, silicon oxide for example, except in a zone 15 which is covered with a conducting deposit, platinium for example, which forms with substrate 131 a Schottky junction;
 a conducting layer 16 such as very slightly resistive polycrystalline silicon, preferably of type P, which covers layer 14 and area 15;
 an insulating layer 17, of silicon oxide for example, which covers layer 16 except where an electrical connection point P is made on the latter. An area 20 which forms a trap area for the charge carriers as described in FIG. 4b, is made by ion implantation in layer 17 at the level of area 15;

a metallic layer in two parts, 18 and 19, part 19 being above areas 15 and 20 and forming the connection Q and part 18 being outside areas 15 and 20 and forming a connection A. FIG. 5b represents the device of the preceding figure in which electrode A has been suppressed.

FIG. 5c is the equivalent electrical circuit of the FIG. 5a and 5b. It shows that the MIIS element E (formed by layers 16, 17, 20 and 19) is connected in series with diode D (formed by the Schottky type junction between layers 13 and 15). In the case of FIG. 5a, the device further comprises a capacitor $C_{a1}$ (formed by layers 16, 17 and 18) connected to common point P (formed by layer 16) between diode D and element E.

As can be seen from the figures, it is a way of producing the diagrams of FIGS. 1 and 2, between points U, P and Q, the MIIS element E also playing the role of capacitor C. It may be noted that, because of the types of conductivity chose, diode D is conducting from P towards U and the element E is inversed, which requires an adaptation of the polarites of the voltage sources shown in FIGS. 1 and 2.

Capacitor $C_{a1}$ between point P and A is only required when the auxiliary voltage $V_a$ is applied between points P and Q.

FIG. 6 show a variant of FIG. 5 which contain capacitor C distinct from that of the MIIS element.

Figure 6A:
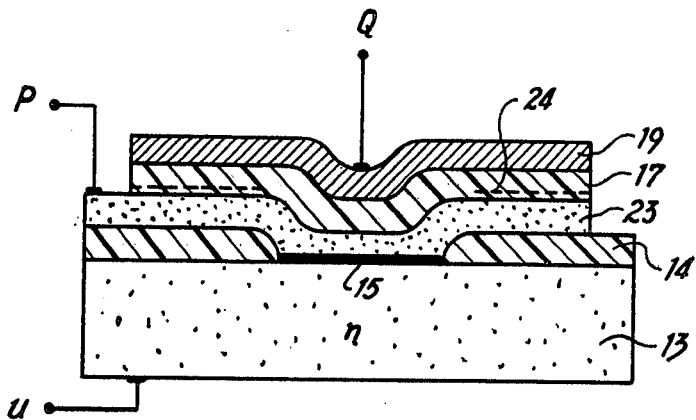

FIG. 6a is identical to FIG. 5b except for the areas 16 and 20 on the latter. Layer 23 (FIG. 6a), which replaces layer 16 on FIG. 5b is still formed by polycrystalline silicon but its resistivity is higher than that of layer 16. As for area 20 of traps for charge carriers in FIG. 5b, it is replaced by an area 24 on FIG. 6a of the same type but extending in ring fashion around layer 15.

Figure 6B:
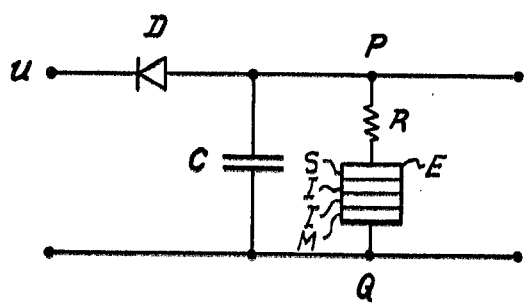

FIG. 6b shows the equivalent circuit of this device which contains:

capacitor C, connected between points P and Q, formed by layer 15, insulator 17 and conductor 19 above the area 15;

element E, connected between the same points P and Q, formed in rings by layers 23, 24, 17 and 19; resistor R in series with element M is obtained by the use of layer 23 of polycrystalline silicon of higher resistivity;

diode D connected between P and U in the same direction as for FIG. 5, formed by layer 15 and substrate 13.

The device of FIG. 6a appears then as a variant of FIG. 5b. It is also possible to adapt it to obtain a variant similar to FIG. 5a with its capacitor $C_{a1}$.

As was said above, an MOS type (Metal — Oxide — Semiconductor) field effect transistor, or MOSFET transistor, can be used for reading, and integrated in the devices of FIGS. 5 and 6 for this purpose. It is then the electrode Q which acts as gate for the MOSFET transistor.

FIG. 7 shows a mode of integrated production of the circuit in FIG. 3.

On this figure can be seen:

a semiconductor substrate, e.g. of silicon, doped $N^+$ in its lower part 28 and N in its upper part 27;

an insulating layer 25, of silicon oxide for example, deposited on substrate 28;

a conducting layer 26, forming the connection point Q, deposited on insulating layer 25;

insulating layer 14, that covers layer 27 except in area 15 and in area 29 where, as layer 27 does not exist, insulating layer 14 covers directly substrate 28;

the metallic deposit on area 15, which forms a Schottky junction with substrate 27;

the area 24 of traps for charge carriers which spreads as a ring round area 15;

the layer 23 of polycrystalline silicon covering area 15 and its immediate neighbourhood;

insulating layer 17 covering layer 23;

conducting layer 19 covering layer 17 and forming connection point M in FIG. 3.

In the dip 29 and above insulator 14 a metallic electrode 30 is deposited, which has to be connected to switch T (see FIG. 3).

Referring to the diagram in FIG. 3, it may be seen that it really is the equivalent electrical circuit of the device in FIG. 7 in which:

the MIIS element E is formed by layers 27, 14, 24 and 23;

resistor R, in series with it, has its value fixed by the resistivity of the polycrystalline silicon 23;

diode D, connected in parallel with the preceding elements, is formed by layers 15 and 27;

capacitor C is formed by substrate 28, insulator 25 and electrode 26;

point P is formed by substrate 28 (or 27);

capacitor $C_1$ is formed by substrate 28, insulator 25 and electrode 30.

To end up, the device in FIG. 7 has no voltage source $E_1$ but has between M and N a capacitor such as $C_{a2}$ (shown on FIG. 2) which is formed by layers 23, 17 and 19.

In a variant of this device, electrode Q can be placed on top using the same method as that for electrode 30.

FIG. 8 shows another embodiment of the circuit in FIG. 3, which is adapted to the recording of a signal carried by elastic surface waves.

It comprises:

a piezoelectic substrate 34 on whose surface elastic wave trains S, which represent the data to be recorded, may be propagated, a flat electrode 35 covering the lower surface of substrate 34 when the elastic waves S are moving on the upper face, the electrode forming connection point Q in FIG. 3, a semiconductor substrate 39, of type N silicon for example, placed opposite the upper surface of substrate 34 but not in contact with it, the upper surface of substrate 39 forming connection point N.

The lower surface of substrate 39 is covered with an insulating layer 37, of silicon oxide for example, which leaves the areas 40 that are covered with a metallic layer to form the Schottky junctions, and then by a low resistivity polycristalline layer 36 which overlaps layer 37. As before a trap area 38 for charge carriers is made in insulating layer 37 by ion implantation for example, to give MIIS structures formed by part of the deposits 36, area 38, layer 37 and substrate 39.

The capacitor C is formed by the space between layer 36 and electrode 35.

In operation, writing pulse $V_e$ is applied as shown in FIGS. 3 and 8, i.e. between point Q (piezoelectric substrate 34) and point N (semiconductor substrate 39). When the elastic wave has passed, a quantity of charges is stored in each diode which is a function of the electric field associated with the elastic wave that acts as voltage $V_s$ in the diagram of FIG. 3. This process is analogous to that which is described in the U.S. Ser. Nos. 532,597 and 581,749 held by THOMSON-CSF.

During the second phase of recording, i.e. the charging of the MIIS element, signal S no longer exists and the three elements D, E and C produce an electric field at the terminals of the MIIS element which, in accordance with the same procedure as before, enables charges to be transferred to area 38.

Reading is obtained between semiconductor substrate 39 and electrode 35 by using elastic wave, called the read wave, which induces an electromotive force, whose amplitude is a function of the number of charges stored, between these elements.

Of course, the invention is not limited to the embodiments described and shown, which were given solely by way of example.

What is claimed is:

1. A non-volatile, long memory for fast signals, comprising at least a first storage stage, comprising a capacitor (C) with two terminals (P and Q) and a diode (D) having two terminals (U and P); a second storage stage with an MIIS element (E); means for storing said fast signal in said first stage by the accumulation of a quantity of electric charges which are a function of said fast signal during a time at least equal to the time for storing a signal in said second stage, said storage in said second stage being done by means of the accumulation at least of a fraction of said quantity of charges at the terminals of the MIIS element.

2. A memory as claimed in claim 1, wherein said diode (D) and said capacitor (C) are connected in series at the first terminal (P) of said capacitor (C) and of said diode, said fast signal ($V_s$) being applied between the second teminal (U) of said diode and the second terminal (Q) of said capacitor, which are the terminals of said first stage, said second stage being connected to the terminals (P and Q) of said capacitor (C).

3. A memory as claimed in claim 1, wherein said diode (D) and said capacitor (C) are connected in series at the first terminal (P) of said capacitor and of said diode, their other termnals (U and Q) forming the terminals of said first stage, said first stage further comprising a further capacitor ($C_1$) and a switch (T), said further capacitor ($C_1$) being connected between the first terminal (P) of said capacitor (C) and said switch (T), said fast signal ($V_s$) being applied between the second terminal (Q) of the capacitor (C), which forms the second terminal of the first stage, and said switch (T), said second stage being connected in parallel to terminals (P and Q) of said capacitor (C), the storing in said first stage being obtained by the application of a write signal ($V_e$) to terminals (U and Q) of said first stage, and the reading of the signal stored in said second stage being obtained between said switch (T) and said second terminal (Q) of the capacitor (C).

4. A memory as claimed in claim 1, wherein said diode (D) and said capacitor (C) are connected in series at the first terminal (P) of said capacitor and of said diode, their other terminals (U and Q) forming the terminals of said first stage, the latter further comprising a switch (T) and a further capacitor ($C_1$), connected between the first terminals (P) of said capacitor (C) and said switch (T), said fast signal ($V_s$) being applied between the second terminal (Q) of said capacitor (C), which forms the second terminal of said first stage, and said switch (T), the second stage being connected in parallel to the terminals (U and P) of said diode (D), the storing in said first stage being obtained by the application of a write signal ($V_e$) between the terminals (U and Q) of said first stage and the reading of the signal stored in second stage being obtained between said switch (T) and said second terminal (Q) of said capacitor (C).

5. A memory as claimed in claim 3, wherein said first stage further comprises a voltage source ($E_1$) for polarizing said diode (D), connected in series with the latter.

6. A memory as claimed in claim 3, further comprising an auxiliary assembly formed by a voltage source ($V_a$) in series with a capacitor ($C_a$) connected between the terminals (P and Q) of said capacitor (C).

7. A memory as claimed in claim 3, further comprising an auxiliary assembly formed by a voltage source ($V_a$) in series with a capacitor ($C_a$) connected between the terminals of a third capacitor ($C_{a3}$) which is connected between the first terminal (U) of the first stage and the said diode (D).

8. A memory as claimed in claim 1, wherein said second stage further comprises a resistor (R) in series with the MIIS element (E).

9. A memory as claimed in claim 1, wherein said capacitor (C) is formed by said MIIS element (E).

10. A memory as claimed in claim 1, formed by a semiconductor substrate (13) covered with a first insulating layer (14) except in an area of said substrate (13) which is covered with a metallic layer (15) that forms with said substrate (13) a Schottky junction, said first insulating layer (14) and said metallic layer (15) being covered with a layer of semiconductor material (16) bearing a connectiom (P) which forms the first terminal of said capacitor (C), said semiconductor layer (16) being convered with a second insulating layer (17) containing an area (20) of traps for charge carriers right above said metallic layer (15), said second insulating layer (17) being covered with a conducting layer (19), which forms the second terminal (Q) of said capacitor (C).

11. A memory as claimed in claim 1, formed by a semiconductor substrate (13) covered with a first insulating layer (14), except in an area of said substrate which is covered with a metallic layer (15) forming with said substrate (13) a Schottky junction, said first insulating layer (14) and said metallic layer (15) being covered with a layer of semiconductor material (23) bearing a connection (P), which forms the first terminal of said capacitor (C), said semiconductor layer (23) being covered with a second insulating layer (17) containing an area (24) of traps for charge carriers placed in ring fashion around said metallic layer (15), said second insulating layer (17) being covered with a conducting layer (19) above said metallic layer (15) and said trap area (24), which forms the second terminal (Q) of said capacitor (C).

12. A memory as claimed in claim 10, further comprising a further conducting layer (18) on said second insulating layer, not in contact with said conducting layer (19), forming with said second insulating layer (17) and said semiconductor layer (16) an auxiliary capacitor ($C_a$).

13. A memory as claimed in claim 11, further comprising a further conducting layer (18) on said second insulating layer, not in contact with said conducting layer (19), forming with said second insulating layer (17) and said semiconductor layer (16) an auxiliary capacitor ($C_a$)

14. A memory as claimed in claim 4, formed by a semiconductor substrate (27, 28) having on its lower surface a first insulating layer (25) covered with a first conducting layer (26) which forms the second terminal (Q) of said capacitor (C), said substrate having on its upper surface a second insulating layer (14), except in an area of the substrate which is covered with a metallic layer (15) that forms with said substrate a Schottky junction, said second insulating layer (14) having an area (24) of traps for charge carriers, placed in ring fashion around said metallic layer (15), and having on the one hand, a layer of semiconductor material (23) above said trap area (24) and said metallic mayer (15) and, on the other, a second conducting layer (30), which is not in contact with said semiconductor layer (23) and forms a connection joined to said switch (T), said semiconductor layer (23) being covered in succession with a third insulating layer (17) and a third metallic layer (19) forming the first terminal of said first stage.

15. A memory as claimed in claim 4, comprising:
  a piezoelectric substrate (34) on which elastic waves may be propagated that represent the said fast signal ($V_s$), the lower surface of said substrate (34) being covered with an electrode (35) forming the second terminal (Q) of said capacitor (C),
  a semiconductor substrate (39) placed opposite the upper surface of said piezoelectric substrate (34), that has a connection forming the first terminal of said first stage and on its lower surface an insulating layer (37) except in areas of the semiconductor substrate (39) which are each covered with a metallic layer (40) that forms with said semiconductor substrate (39) a Schottky junction, said insulating layer (37) having an area (38) of traps for charge carriers, said metallic layers (40) being covered with a semiconductor layer (36); reading being carried out between said semiconductor substrate (39) and said electrode (35) using an elastic read wave.

16. A memory as claimed in claim 10, wherein said semiconductor substrate is formed of type N silicon, said insulating layers by silicon oxide, said semiconductor layer by polycrystalline silicon, said trap areas for charge carriers being made by an insulating layer with ion implantation therein.

17. A memory as claimed in claim 11, wherein said semiconductor substrate is formed of type N silicon, said insulating layers by silicon oxide, said semiconductor layer by polycrystalline silicon, said trap areas for charge carriers being made by an insulating layer with ion implantation therein.

18. A memory as claimed in claim 15, wherein said semiconductor substrate is formed of type N silicon, said insulating layers by silicon oxide, said semiconductor layer by polycrystalline silicon, said trap areas for charge carriers being made by an insulating layer with ion implantation therein.

19. A memory as claimed in claim 15, wherein said semiconductor substrate is formed of type N silicon, said insulating layers by silicon oxide, said semiconductor layer by polycrystalline silicon, said trap areas for charge carriers being made by an insulating layer with ion implantation therein.

* * * * *